(12) United States Patent
Oh

(10) Patent No.: US 7,397,708 B2
(45) Date of Patent: Jul. 8, 2008

(54) TECHNIQUE TO SUPPRESS LEAKAGE CURRENT

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 11/196,369

(22) Filed: Aug. 3, 2005

(65) Prior Publication Data

US 2007/0030738 A1    Feb. 8, 2007

(51) Int. Cl.
*G11C 7/10* (2006.01)
(52) U.S. Cl. .................. 365/189.01; 365/227; 365/229
(58) Field of Classification Search ............ 365/189.01, 365/227, 229, 189.09, 230.06
See application file for complete search history.

(56) References Cited

U.S. PATENT DOCUMENTS

| | | | | |
|---|---|---|---|---|
| 5,511,026 A | * | 4/1996 | Cleveland et al. ...... | 365/189.09 |
| 6,163,481 A | * | 12/2000 | Yamada et al. ......... | 365/185.11 |
| 6,307,805 B1 | * | 10/2001 | Andersen et al. ....... | 365/230.06 |
| 7,274,247 B2 | * | 9/2007 | Ward et al. ................... | 327/534 |
| 2003/0198101 A1 | * | 10/2003 | Pio ............................ | 365/200 |
| 2004/0113672 A1 | * | 6/2004 | Kang et al. ................. | 327/185 |
| 2006/0133185 A1 | * | 6/2006 | Miller et al. ........... | 365/230.06 |

* cited by examiner

*Primary Examiner*—Tuan T Nguyen
*Assistant Examiner*—Dang Nguyen
(74) *Attorney, Agent, or Firm*—Patterson & Sheridan, L.L.P.

(57) ABSTRACT

Embodiments of the invention generally provide a method and wordline driver having a reduced leakage current. In one embodiment, a wordline is driven to a boosted high voltage with a driver transistor of the wordline driver if the wordline driver is in an operational mode and the wordline is driven to a downward-driven low voltage if the wordline driver is in a standby mode. The driver transistor is electrically isolated from the downward-driven low voltage of the wordline when the wordline driver is in the standby mode. A leakage current in the wordline driver is thereby reduced.

25 Claims, 7 Drawing Sheets

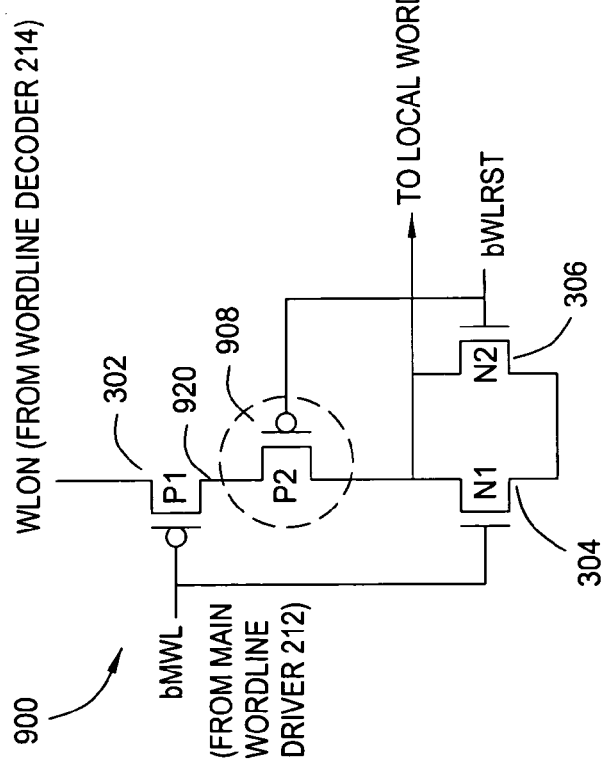
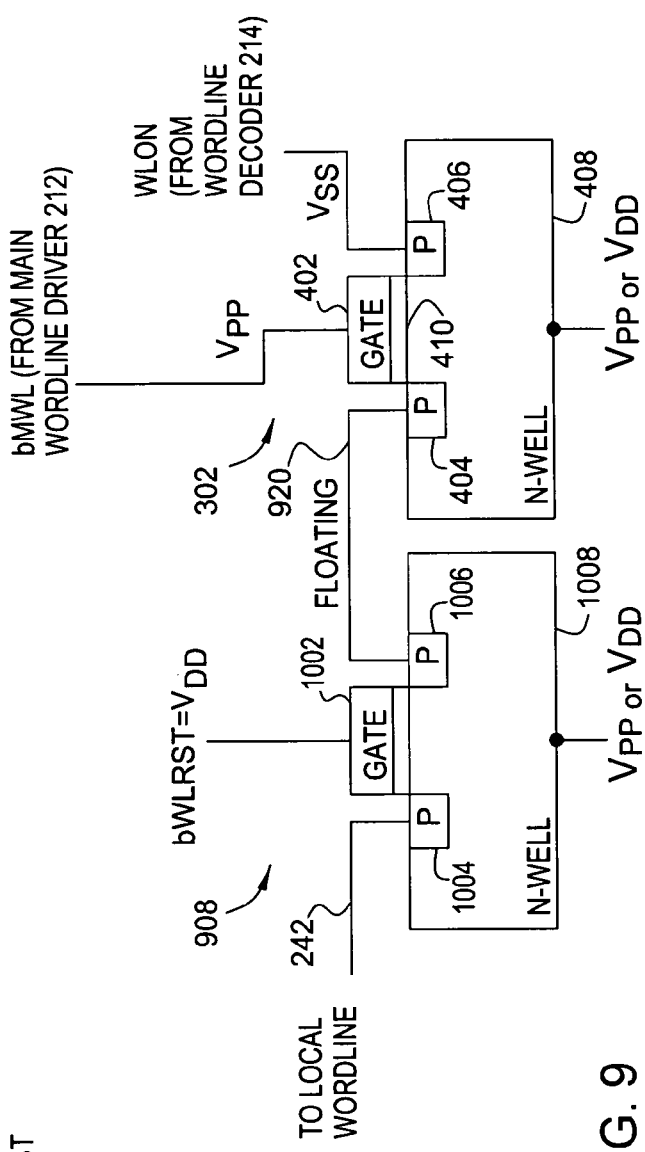
FIG. 8
FIG. 9

TECHNIQUE TO SUPPRESS LEAKAGE CURRENT

BACKGROUND OF THE INVENTION

1. Field of the Invention

Embodiments of the present invention generally relate to leakage currents in integrated circuit (IC) devices.

2. Description of the Related Art

Modern mobile electronic devices such as digital music players, portable digital assistants (PDAs), cell phones, and laptops require increasing amounts of memory to handle the computing demands of users of the devices. Accordingly, modern mobile electronic devices typically employ some sort of random access memory (RAM), such as dynamic random access memory (DRAM), either as a separate integrated circuit (IC) or combined with a processor, for instance as part of a cache or a system on a chip (SOC). DRAM memories consume power, and because mobile electronic devices may have a limited power supply provided by a battery, there is an increased demand for low-power memories for use in such mobile devices. Such low-power memories may include low-power single data rate (LP-SDR) DRAM, low-power double data rate (LP-DDR) DRAM, and pseudo-static RAM (PSRAM).

FIG. 1 is a block diagram depicting an exemplary memory device 100. The memory device may have control circuits 102 accessed using a memory I/O interface. The control circuits 102 may be used to access one or memory arrays 104 of the memory and may issue control signals to components within the memory array 104. FIG. 2 is a block diagram depicting an exemplary memory array 104. The memory array 104 may contain a row decoder 210 and a column decoder 220. Each time a memory address in the memory array 104 is accessed, the address may be decoded by the row decoder 210 and column decoder 220 to determine at which row (also referred to as a wordline or main wordline 240) and which column (also referred to as a bitline 250) in the array the memory address resides. When the memory address is decoded by the row decoder 210 to select a wordline 240 from the memory array 104, a main wordline driver 212 may drive a signal (MWL) onto the selected wordline 240, thus enabling data to be accessed from the selected wordline 240. The memory array 104 may also contain many other elements (not shown), such as sense amplifiers, which may be used to access (e.g., read, write, or refresh) the memory array 104.

In some cases, the memory device 100 may utilize a segmented wordline structure. In a segmented wordline structure, each memory array 104 may contain multiple memory segments 230 and each segment may contain an array of memory cells 218. To activate the memory cells 218 in each memory segment 230, the row decoder 210 may first be used to decode the memory address and select a segment 230 within the memory array 104. After a segment 230 has been selected, the memory address may be further decoded to access a local row (referred to as a local wordline 242) within the segment 230. The process of decoding a memory address to select a segment 230 and a local wordline 242 within a segment may be referred to as hierarchical decoding.

Each local wordline 242 may have a local wordline driver 216 used to drive the local wordline 242. For any one memory address being accessed, one wordline 240 and one local wordline 242 may be activated while many wordlines 240 and many local wordlines 242 are not activated. The wordline 240 and the local wordline which are selected may be in what is referred to as an operational mode. The wordlines 240 and local wordlines 242 which are not selected may, in some cases, be in a state or mode referred to as a standby state or standby mode.

A signal (referred to as WLON) output by a wordline decoder 214 to each local wordline driver 216 may be used to determine whether the local wordline driver 216 is activated. Each wordline decoder 214 may control several local wordline drivers 216 (also referred to as a column or cluster of local wordline drivers 216). When WLON is asserted to a high voltage and MWL is also a high voltage, the local wordline driver 216 may be activated. When WLON is lowered to a low voltage (e.g., $V_{SS}$), the local wordline driver 216 may be inactive. When a wordline 242 is inactive, it may be reset using a wordline reset signal (WLRST).

FIG. 3 is a circuit diagram depicting an exemplary local wordline driver 216. The local wordline driver may have an inverter (PMOS transistor P1 302 and NMOS transistor N1 304) which drives local wordline 242 as well as a reset transistor (NMOS transistor N2 306) which resets local wordline 242. The inverter may be controlled by the bMWL signal (the complement of the MWL signal) and the reset transistor 306 may be driven by bWLRST signal (the complement of the WLRST signal).

Operation of the Local Wordline Driver

Table 1 depicts the signals used to control the local wordline driver 216 as well as the corresponding state of the local wordline driver 216.

TABLE 1

Local Wordline Driver States

| Driver State | bMWL | WLON | bWLRST | Wordline Driver Output |
|---|---|---|---|---|
| Wordline selected, local wordline driver not selected | $V_{WLOFF}$ | $V_{SS}$ | $V_{DD}$ | $V_{WLOFF}$ |
| Wordline and local wordline selected | $V_{WLOFF}$ | $V_{PP}$ | $V_{WLOFF}$ | $V_{PP}$ |
| Main wordline not selected, local wordline driver selected | $V_{PP}$ | $V_{PP}$ | $V_{WLOFF}$ | $V_{WLOFF}$ |
| Standby mode | $V_{PP}$ | $V_{SS}$ | $V_{DD}$ | $V_{WLOFF}$ |

If a memory access is made which utilizes a given main wordline 240 and local wordline 242, the wordline driver 212 for the main wordline 240 may assert the MWL signal, selecting the main wordline 240. When the MWL signal for the main wordline 240 is asserted, the bMWL signal may be lowered, driving the WLON value for the local wordline driver 216 through the PMOS transistor P1 302. If bMWL is lowered and the local wordline 242 is not selected during a memory access, a low power supply voltage ($V_{SS}$) may be applied to WLON and driven onto the local wordline 242. If bMWL is lowered and the local wordline 242 is selected during a memory access, the wordline decoder 214 for the local wordline driver 216 asserts the WLON signal to a boosted high voltage ($V_{PP}$), and the asserted WLON signal is driven onto the local wordline 242, allowing the local wordline 242 to be accessed. In some cases, the main wordline 240 for a local wordline driver 216 may not be selected (bMWL=$V_{PP}$), but the column of local wordline drivers controlled by a wordline decoder 214 containing the local wordline driver 216 may be selected (WLON=$V_{PP}$). In such a case, the local wordline 242 is not selected, and the output of the local wordline driver 216 is VWLOFF.

The boosted high voltage $V_{PP}$ (also referred to as the upward-driven high voltage) may be maintained by a charge pump. A charge pump is a circuit which may utilize a capacitor to increase a voltage above a positive power supply voltage or decrease a voltage below a negative power supply voltage. Thus, $V_{PP}$ may be greater than a positive power supply voltage (referred to as $V_{DD}$) utilized by the memory device 100.

The local wordline 242 is typically driven to the boosted high voltage $V_{PP}$ (also referred to as $V_{CCP}$, or $V_{CC}$ pumped, where $V_{CC}$ is the high power supply voltage) so that the high power supply voltage $V_{CC}$ (also referred to as $V_{DD}$) can be successfully written into memory cells in the memory array 104, for example, by compensating for switching transistor voltage drops. In some cases, the switching transistor voltage drops may be due partly to a threshold voltage of the switching transistor (referred to as $V_{TH}$) and the boosted voltage may be selected to overcome the threshold voltage when a high voltage is being written to the memory cell, such that $V_{PP}$ is equal to $V_{CC}+V_{TH}$.

When an access to the main wordline 240 is not occurring, the main wordline 240 and local wordline 242 may be deselected. Thus, for the main wordline 240, the MWL signal may be lowered to a low value, and bMWL may be raised to a high logic value, $V_{PP}$. For the local wordline 242, the local wordline signal WLON may be lowered to $V_{SS}$ (deselecting the local wordline 242) and the wordline reset signal WLRST may be asserted, lowering bWLRST to a low logic value and causing the local wordline 242 to be reset to a wordline off voltage. In some cases, the wordline off voltage may be a low voltage, $V_{SS}$. In other cases, the wordline off voltage may the downward-driven low voltage $V_{WLOFF}$ (also referred to as a downward-boosted low voltage) which may be maintained by a charge pump. Thus, $V_{WLOFF}$ may be a lower voltage (e.g., a negative voltage) than the low power supply voltage $V_{SS}$. When the main wordline 240 and the local wordline 242 are not selected, the local wordline driver 216 may be in the standby mode.

FIG. 4 is a substrate view depicting an exemplary PMOS transistor P1 302 in a local wordline driver 216 during a standby mode. The PMOS transistor 302 may have a gate 402, a gate oxide layer 410, a source 406, a drain 404, and may be located in an N-well 408 (sometimes referred to as the substrate with respect to a PMOS transistor). When the local wordline driver 216 is in standby mode, the gate voltage may be $V_{PP}$, the source voltage may be $V_{SS}$, and the drain voltage may be VWLOFF. The N-well substrate voltage may also be $V_{PP}$. Applying a voltage to the N-well 408 may be referred to as biasing. Biasing the N-well substrate 408 may lower the threshold voltage ($V_{TH}$) of the PMOS transistor P1 302 and improve the operating characteristics of the PMOS transistor 302.

When the transistor is in the standby mode, the gate to drain voltage ($V_{GD}$) may be large ($V_{PP}$+|VWLOFF|) because both the gate and drain voltages ($V_{PP}$ and VWLOFF, respectively) are being driven by charge pumps. This creates a strong reverse bias across the gate 402 and drain 404. When there is a strong reverse bias across the gate 402 and drain 404, an effect known as Gate-Induced Drain Leakage (GIDL) may develop. GIDL creates a current (labeled $I_{GIDL}$) flowing from the N-well substrate 408 to the drain 404 (in some cases, the direction is from the drain 404 to the N-well substrate 408). $I_{GIDL}$ is proportional to the voltage difference between the gate 402 and drain 404, and may be caused by band to band tunneling (BTBT) and/or trap assisted tunneling (TAT) of electrons occurring in the drain region 404. The negatively-charged electrons flow from the drain 404 to the N-well substrate 408, creating $I_{GIDL}$. Conventionally, the direction of current flow is defined as the flow of positive charge, so the direction of $I_{GIDL}$ is from the N-well 408 to the drain 404 (opposite the direction of the flow of electrons). Because the $I_{GIDL}$ flows from the N-well 408 to the drain 404, the current due to GIDL may also be increased by the N-well bias ($V_{PP}$) and the drain bias VWLOFF which may both be driven by charge pumps ($V_{PP}$ is driven upwards, VWLOFF is driven downwards).

Thus, even though the local wordline driver 216 is in a standby mode, a significant leakage current due to GIDL may drain power from the driver 216. The power consumption may be increased by the charge pumps which drive VWLOFF and $V_{PP}$. The increased power consumption may be due to both the increased bias across the gate 402 and drain 404 and may also be due to inefficiency of the charge pumps which consume power while maintaining VWLOFF and $V_{PP}$. The GIDL effect may also be increased by aspects of the process used to manufacture the memory device 100, such as decreased gate oxide thickness or doping in transistors of the memory device 100.

Referring back to FIG. 2, as depicted, each segment 230 in a memory array 104 may have several local wordline drivers 216, and due to the large number of segments 230, the memory array 104 may contain a large number of local wordline drivers 216, each of which may be placed in a standby mode. Because of the large number of local wordline drivers 216 in standby mode, the total leakage current and power loss due to GIDL may become substantial. A specification for a DRAM device may require low power consumption. The leakage current due to GIDL may cause the DRAM device to fail to meet the desired specification.

Accordingly, what is needed is a wordline driver for and method of suppressing a leakage current.

SUMMARY OF THE INVENTION

Embodiments of the invention generally provide a method and wordline driver having a reduced leakage current.

In one embodiment, method and wordline driver for reducing gate induced drain leakage is provided. A charge pump generates a boosted high voltage from a power supply high voltage. The boosted high voltage is applied to an N-well of the wordline driver if the wordline driver is in an operational mode and the power supply high voltage is applied to the N-well of the wordline driver if the wordline driver is in a standby mode.

One embodiment provides a method and wordline driver for reducing gate induced drain leakage. In one embodiment, a wordline is driven to a boosted high voltage with a driver transistor of the wordline driver if the wordline driver is in an operational mode and the wordline is driven to a downward-driven low voltage if the wordline driver is in a standby mode. The driver transistor is electrically isolated from the downward-driven low voltage of the wordline when the wordline driver is in the standby mode.

One embodiment provides a wordline driver having a reduced gate induced leaked current during a standby mode. According to one embodiment, the wordline driver has driver circuitry to drive a wordline to a boosted high voltage with an NMOS depletion mode driver transistor if the wordline driver is in an operational mode and selected by a wordline driver and to drive the wordline to a downward-driven low voltage if the wordline driver is in a standby mode. The wordline driver also has isolation circuitry to electrically isolate the driver transistor from the downward-driven low voltage of the wordline when the wordline driver is in the standby mode.

One embodiment provides a wordline driver having a reduced gate induced leaked current during a standby mode comprising. In one embodiment, the wordline driver has means for driving a wordline. The means for driving the wordline is configured to drive the wordline to a boosted high voltage with a driver transistor of the wordline driver if the wordline driver is in an operational mode and drive the wordline to a downward-driven low voltage if the wordline driver is in a standby mode. The wordline driver also has means for electrically isolating. The means for electrically isolating is configured to electrically isolate the driver transistor from the downward-driven low voltage of the wordline when the wordline driver is in the standby mode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 is a circuit diagram depicting a local wordline driver with a cut-off transistor according to one embodiment of the invention.

FIG. 9 is a substrate view which depicts a connection between the source of a cut-off transistor and the drain of a driver transistor during a standby mode according to one embodiment of the invention.

DETAILED DESCRIPTION OF THE PREFERRED EMBODIMENT

Embodiments of the invention generally provide a method and wordline driver having a reduced leakage current. When the wordline is in an operational mode, a driver transistor of the wordline driver may drive the wordline to a boosted high voltage. When the wordline is in a standby mode, the wordline may be driven to a downward-driven low voltage. According to one embodiment, the driver transistor in the wordline driver may be electrically isolated from the downward-driven low voltage of the wordline during the standby mode. By electrically isolating the driver transistor during standby mode, a gate induced drain leakage in the driver transistor may be reduced.

To facilitate understanding, the following description will refer to memory devices, such as dynamic random access memory (DRAM) devices, as specific, but not limiting examples of devices in which the circuits described herein may be utilized. Further, while the following description may refer certain control signals as being asserted to high logic signals or lowered to low logic signals, those skilled in the art will recognize that such signal levels are merely exemplary and that any circuitry described herein may be configured to use any number of signals of any polarity and/or voltage level. Also, while some signals are referred to as originating from a given control circuit or device, it should be recognized that any described control signal may originate from any given circuit or device. In addition, while gate-induced drain leakage (GIDL) is described below as originating from an N-well substrate and flowing to a drain, in some circuit configurations GIDL may flow from any type of substrate to either a drain or a source of any type of transistor. Embodiments of the invention may be used to reduce GIDL in such configurations.

Any signal names described herein are exemplary, and in general embodiments of the invention may be implemented with any signal(s) bearing any name(s), and/or from any signal(s) derived from one or more such signals. Similarly, described implementations of certain circuits are merely exemplary. In some cases, simplified implementations of such circuits may be presented in order to better explain aspects of embodiments of the present invention. However, those skilled in the art will recognize that embodiments of the present invention may be adapted for use with any implementation or configuration of such circuits, including complicated and/or commercial implementations of such circuits.

Gate Induced Leakage in a Local Wordline Driver

Figure 1:
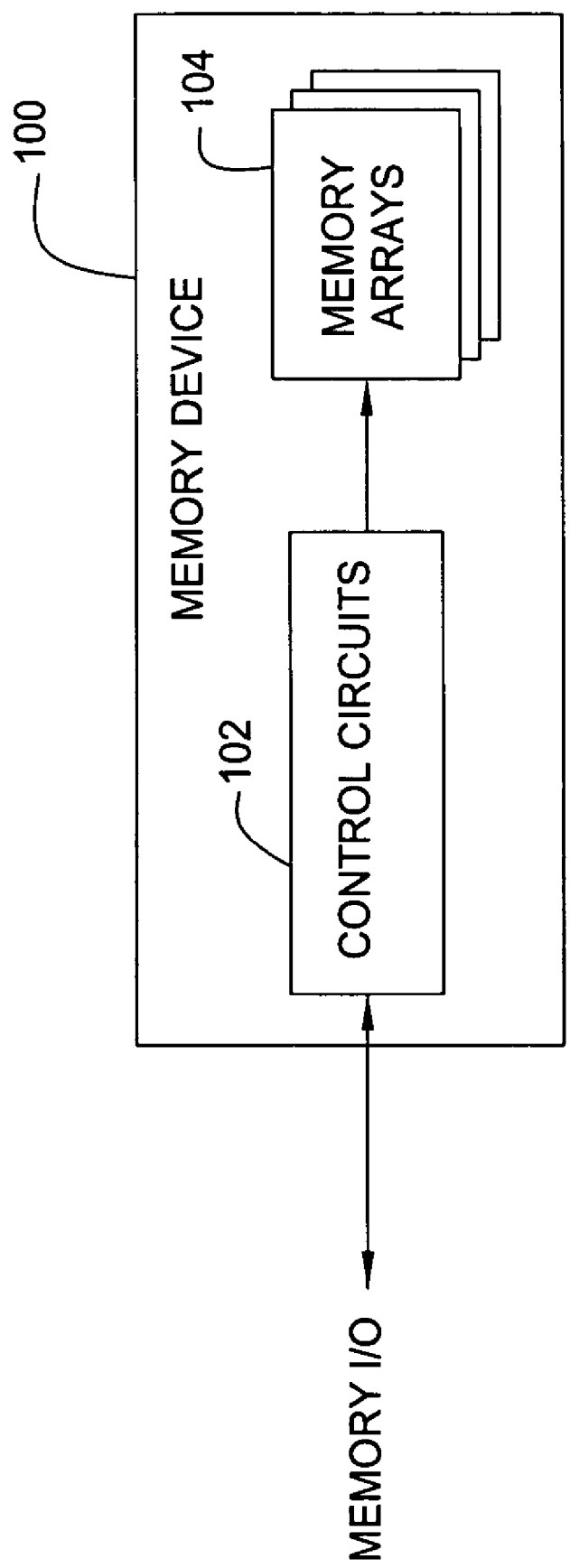
FIG. 1 is a block diagram depicting an exemplary memory device.
Figure 2:
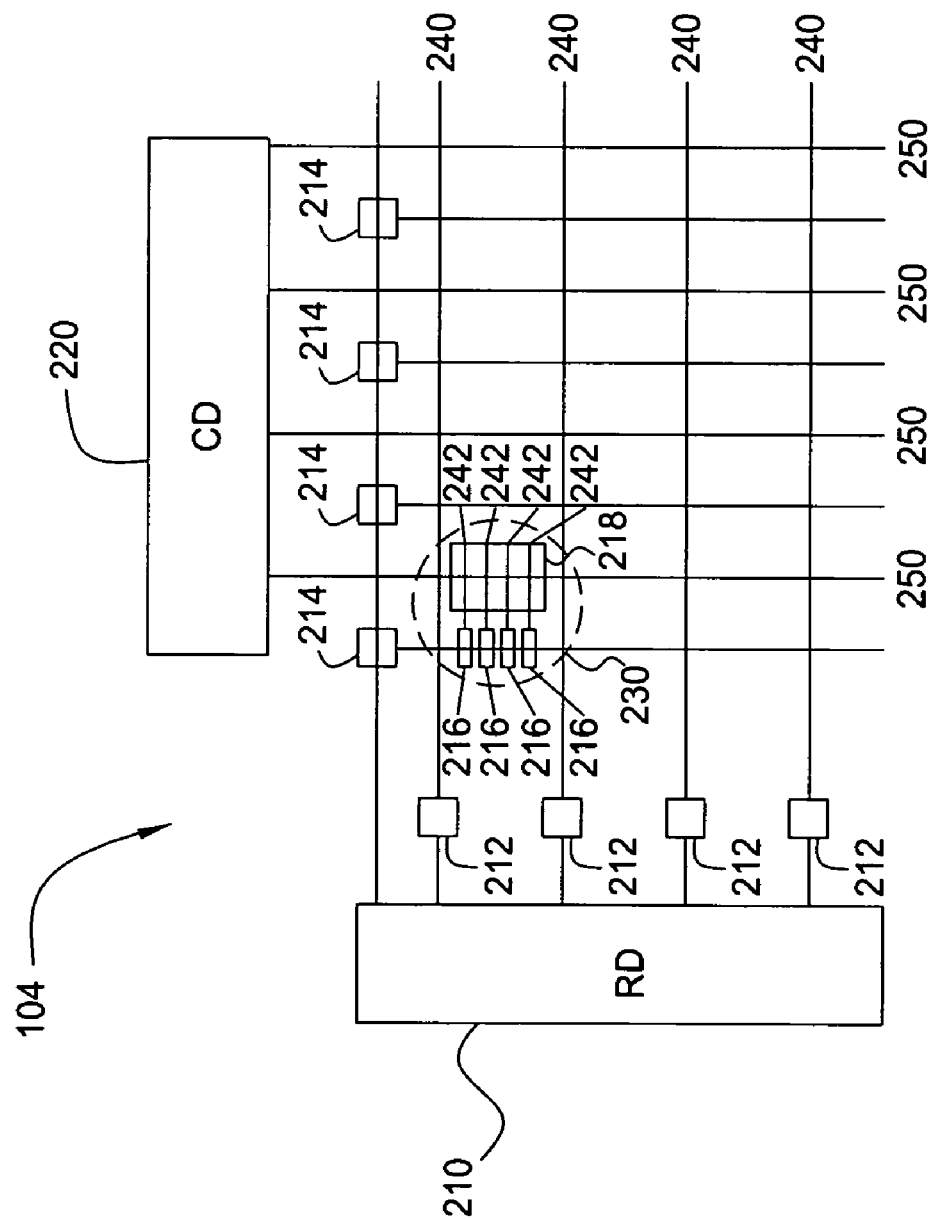
FIG. 2 is a block diagram depicting an exemplary memory array.
Figures 3, 4:
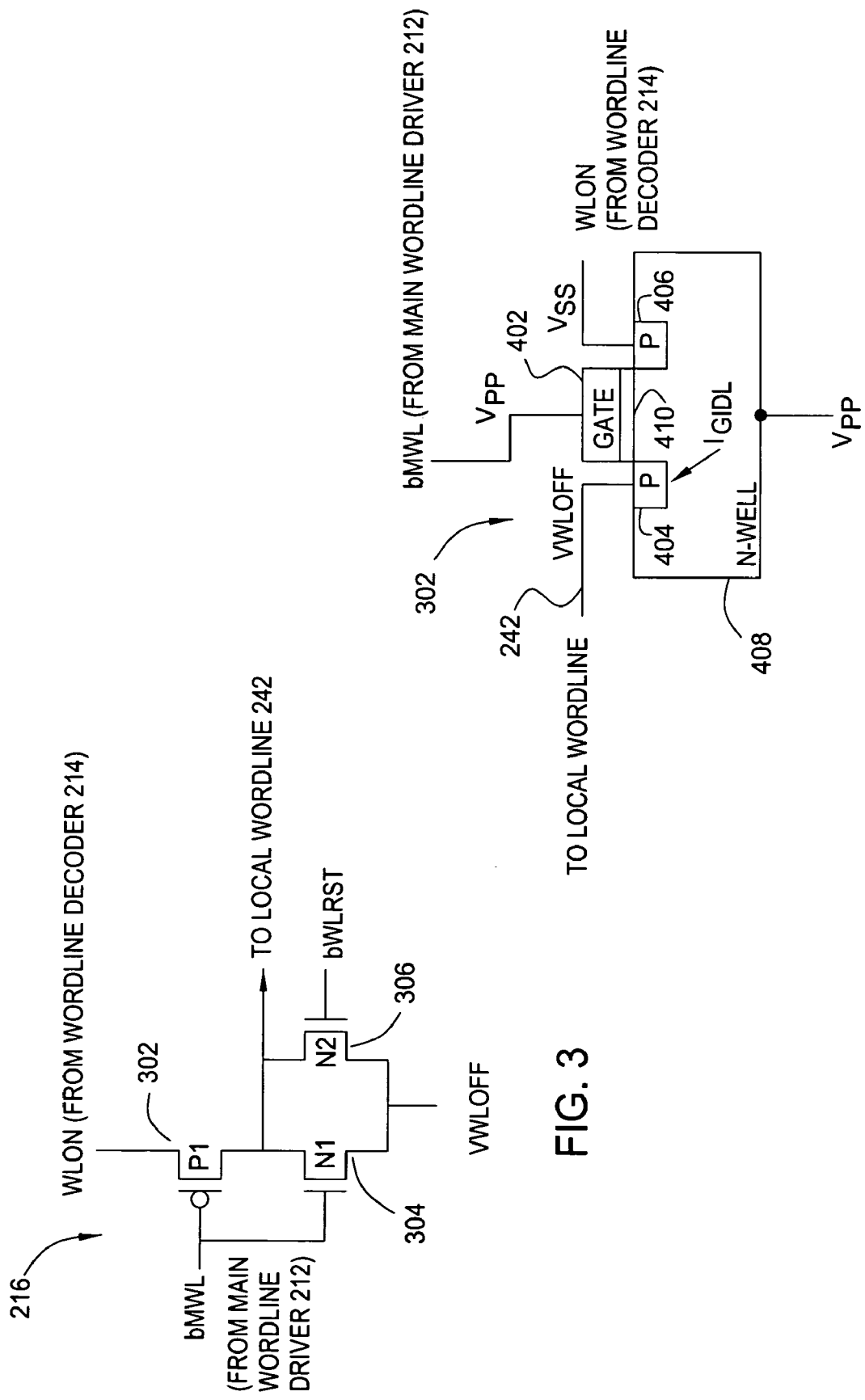
FIG. 3 is a circuit diagram depicting an exemplary local wordline driver.
FIG. 4 is a substrate view depicting an exemplary PMOS transistor in a local wordline driver and voltages present during a standby mode.

As previously described with respect to FIG. 4, gate induced drain leakage (GIDL) current in the PMOS transistor P1 302 of the local wordline driver 216 may be proportional to a gate to drain voltage, $V_{GD}$ and may also be increased by the charge pumps which drive the voltage for the drain 404 (VWLOFF) and the N-well substrate 408 (VPP).

With respect to the gate to drain voltage $V_{GD}$, the gate voltage of the local wordline driver 216 may be a high voltage boosted by a charge pump ($V_{PP}$). With respect to the drain voltage, the drain voltage may be a low voltage driven downward by a voltage pump (VWLOFF). Thus, $V_{GD}$ may be larger than the difference between the high power supply voltage ($V_{DD}$) and the low power supply voltage ($V_{SS}$), exacerbating the GIDL effect.

Figure 5:
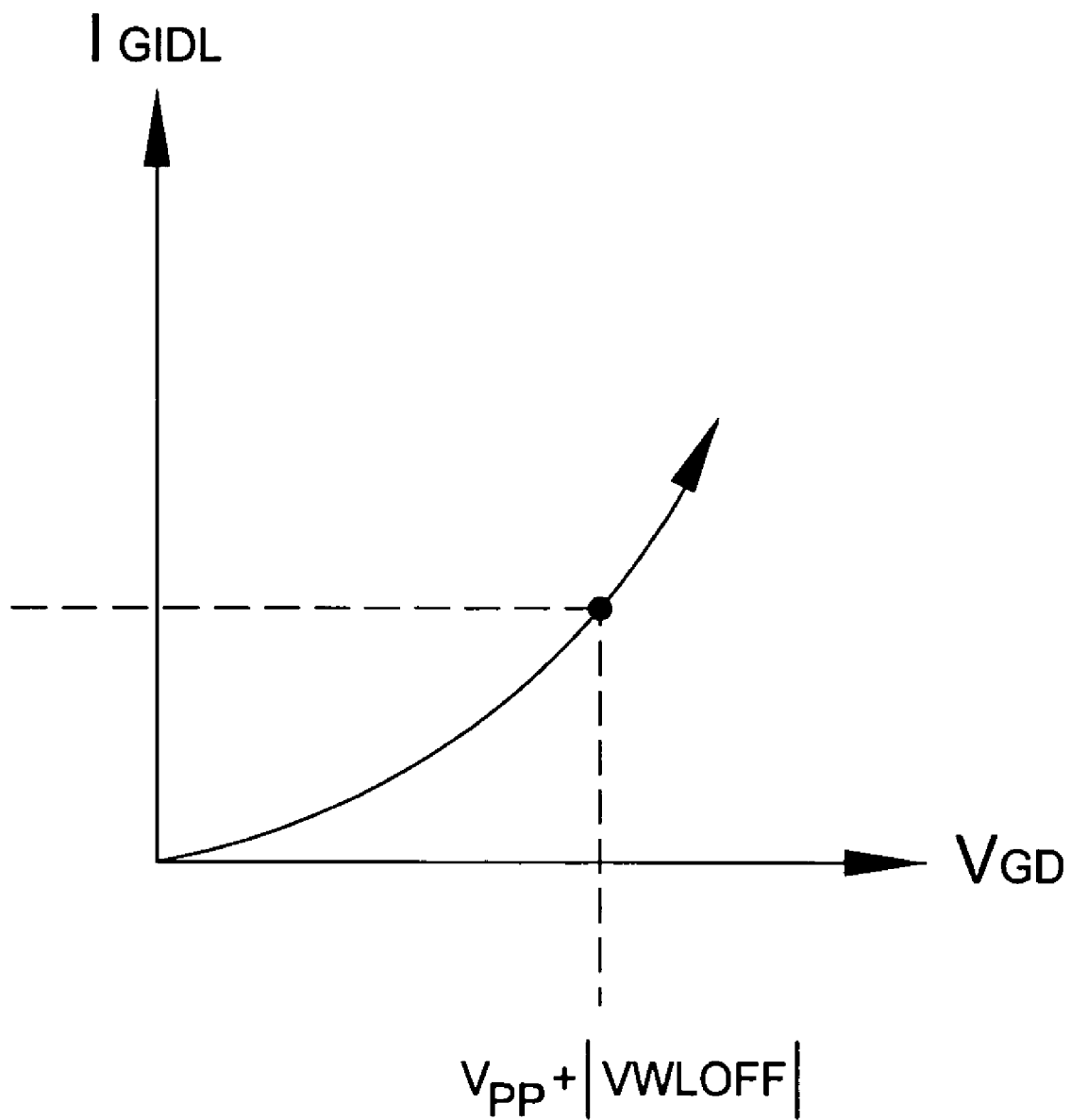
FIG. 5 is a graph which depicts the effect of a gate to drain voltage ($V_{GD}$) on a gate induced drain leakage (GIDL).

The power loss due to GIDL is increased further by the fact that the N-well substrate bias and the drain voltage are driven (in opposite directions) by charge pumps. The N-well substrate bias $V_{PP}$ is driven upwards by a charge pump and the drain voltage VWLOFF is driven downwards by a charge pump. Accordingly, any voltage drop due to power consumed by GIDL may be replenished by the charge pumps. The charge pumps themselves may be inefficient at driving voltages, and thus the charge pumps themselves may consume power due to GIDL. The overall leakage current due to GIDL may be described by the notation:

$$I_{CC}(GIDL) = I_{GIDL} \times (1 + V_{PP}\text{ Pump} + |\text{VWLOFF Pump}|)$$

where $I_{CC}(GIDL)$ is the total drain on the power supply due to GIDL, $V_{PP}$ Pump is the current drain due to the charge pump for the boosted positive voltage $V_{PP}$, and |VWLOFF Pump| is the current drain due to the charge pump for the downward driven negative voltage VWLOFF. FIG. 5 is a graph which depicts the effect of $V_{GD}$ on $I_{GIDL}$ on the PMOS transistor P1 302.

Reducing GIDL by Lowering the N-Well Bias

According to one embodiment of the invention, the power consumption due to GIDL may be decreased by decreasing the N-well bias of the PMOS transistor P1 302 when the transistor 302 is in a standby mode. For example, when the local wordline driver 216 is in the standby mode, the N-well bias of the transistor 302 may be lowered from the boosted high voltage $V_{PP}$ to the high power supply voltage $V_{DD}$. By biasing N-well to $V_{DD}$ power instead of charge-pumped $V_{PP}$, the overall power consumption may be reduced by the amount of current drain in the charge pump for $V_{PP}$.

Figure 6:
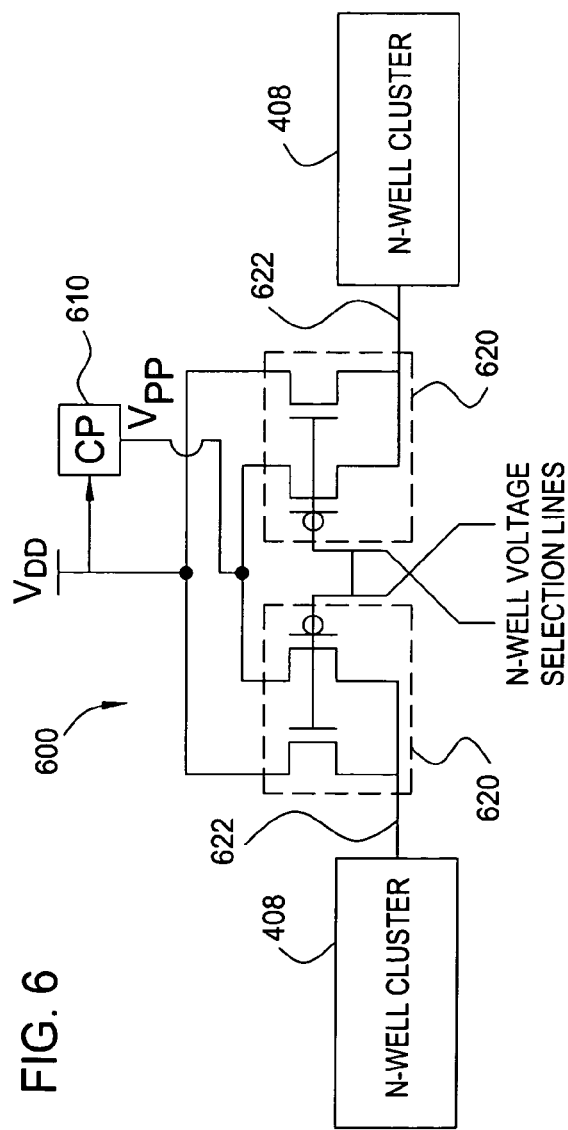
FIG. 6 is a circuit diagram depicting a circuit for changing the N-well bias of one or more local wordline drivers according to one embodiment of the invention.

FIG. 6 is a circuit diagram depicting a voltage selection circuit 600 for changing the N-well bias of one or more local wordline drivers 216 according to one embodiment of the invention. The circuit 600 may contain one or more multiplexers (also referred to as MUXes) 620 which may be used to select the N-well voltages for different clusters of N-wells 408. The selected voltage may be applied using one or more N-Well voltage lines 622. Thus, when a cluster of local wordline drivers 216 is in the standby mode (e.g., not selected by the main wordline driver 212 or the wordline decoder 214), the N-well voltages for that cluster may be lowered to reduce GIDL.

N-well voltage selection lines may be used to control each MUX 620. The N-well voltage selection lines may select between two input voltages to each MUX 620, the high power supply voltage $V_{DD}$ and the boosted high voltage $V_{PP}$. $V_{PP}$ may be boosted from the high power supply voltage $V_{DD}$ by a charge pump 610.

When the local wordline driver is in the operational mode, the appropriate N-well voltage selection line for the N-well cluster 408 of the local wordline driver transistor 302 (See FIG. 7) may be set to a low logic value (e.g., $V_{SS}$), thus applying the boosted high voltage $V_{PP}$ to the N-well cluster for the local wordline driver transistor. When the local wordline driver is in the standby mode, the N-well voltage selection line for the N-well 408 of the local wordline driver transistor 302 may be changed to a high logic level (e.g., $V_{DD}$), thus applying the high power supply voltage $V_{DD}$ to the N-well cluster 408.

In one embodiment of the invention, the N-well voltage may be switched to $V_{SS}$ instead of $V_{DD}$. Where $V_{SS}$ is used as the N-well voltage instead of $V_{DD}$, the power loss due to GIDL may be decreased further. However, when the N-well 408 is switched back to $V_{PP}$, more power may be consumed because the charge pump 610 may have to drive the N-well voltage further from $V_{SS}$ (which may be stored by the capacitance in the N-well 408) to $V_{PP}$, the boosted high voltage. Where the N-well 408 is switched to $V_{DD}$ during standby, the charge pump 610 may not need to consume as much power in overcoming the voltage difference ($V_{PP}$-$V_{DD}$).

Figure 7:
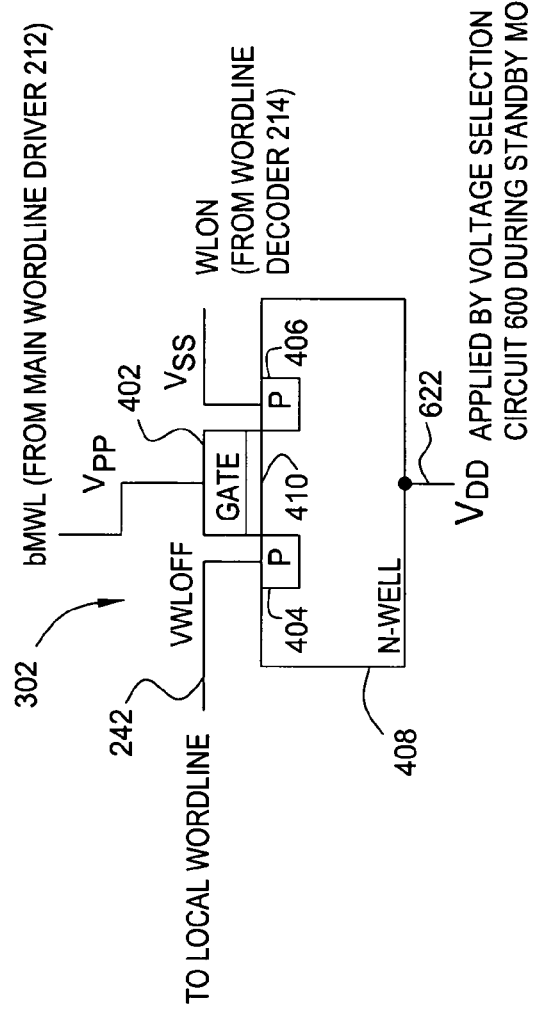
FIG. 7 is a substrate view depicting a PMOS transistor in a local wordline driver during a standby mode wherein a high power supply voltage is applied to the N-well of the PMOS transistor according to one embodiment of the invention.

FIG. 7 is a substrate view depicting the PMOS transistor 302 in the local wordline driver 316 during the standby mode wherein the high power supply voltage is applied to the N-well 408 of the PMOS transistor 302 according to one embodiment of the invention. By applying $V_{DD}$ to the N-well 408 in standby mode, the charge pump 610 may no longer drive the N-well 408 to the boosted high voltage $V_{PP}$. Because the gate 402 is still at the boosted high voltage $V_{PP}$ and the drain 404 is at the downward-driven low voltage VWLOFF, GIDL may consume some power (in some cases, the drain 404 may also be maintained at $V_{SS}$). However, because the charge pump 610 is not used to drive the N-well to $V_{PP}$, the power consumed by the GIDL current $I_{GIDL}$ is reduced.

Where the voltage applied to the N-well 408 is reduced to $V_{DD}$ during a standby mode of the local wordline driver 216, the overall leakage current due to GIDL may be described by the notation:

$$I_{CC}(GIDL)=I_{GIDL}\times(1+|VWLOFF\text{ Pump}|)$$

where $I_{CC}$(GIDL) is the total drain on the power supply due to GIDL, and |VWLOFF Pump| is the current drain due to the charge pump for the downward driven negative voltage VWLOFF. When compared to the equation provided with respect to a configuration where the N-well bias is not switched (see description above with respect to FIG. 4), the power consumed by GIDL is reduced in amount by the power consumed by the charge pump 610 for the boosted high voltage.

Reducing GIDL with a Cut-Off Transistor

According to one embodiment of the invention, GIDL may be reduced by inserting a cut-off transistor into the local wordline driver 216. FIG. 8 is a circuit diagram depicting a local wordline driver 900 with a cut-off transistor 908 according to one embodiment of the invention. In one embodiment, the cut-off transistor 908 may be controlled by the complement of the WLRST signal, bWLRST.

When the local wordline driver 900 is in the operational mode, bWLRST may be lowered to a downward driven negative logic value (e.g., VWLOFF), turning the cut-off transistor 908 on and allowing the PMOS transistor 302 (also referred to as the driver transistor 302) to output the wordline select signal WLON from the wordline decoder 214 when the complement of the main wordline signal (bMWL) is lowered to a low logic level (e.g., VWLOFF) by the main wordline driver 212 (bMWL and WLON are described above with respect to Table 1 and FIG. 3).

When the local wordline driver 900 is in the standby mode, bWLRST may be raised to a high logic level (e.g., $V_{DD}$), turning the cut-off transistor 908 off. When the cut-off transistor 908 is turned off, the connection 920 between the source of the cut-off transistor 908 and the drain of the driver transistor 302 may be electrically isolated (i.e., "cut off") from the local wordline 242 as well as other voltages in memory device 100. An electrically isolated connection (also referred to node or line) may be referred to as a floating connection.

A floating connection may not draw power from a power supply because the floating connection is electrically isolated from the power supply. The voltage of a floating connection may vary. For example, when the connection 920 is cut-off or floated, capacitance of the connection 920 may retain the previous voltage which was on the connection 920 just before it was floated. However, the electrical isolation may not be perfect, and in some cases leakage currents may reduce or increase the voltage of the floating connection 920 as described below.

FIG. 9 is a substrate view which depicts the connection 920 between the source 1006 of the cut-off transistor 908 and the drain 404 of the driver transistor 302 during the standby mode according to one embodiment of the invention. As previously stated, the gate 1002 of the cut-off transistor 908 may be connected to bWLRST and the drain 1004 of the cut-off transistor 908 may be connected to the local wordline 242.

As previously described, when the local wordline driver 900 is placed in the standby mode, the connection 920 may be floated. If WLON is a high voltage when the connection 920 is floated, $V_{GD}$ may be small such that $I_{GIDL}$ is greatly reduced or eliminated entirely. If WLON is a low voltage when the connection 920 is floated, $I_{GIDL}$ may flow for a brief period of time, causing the floated voltage to increase. As the voltage of the floated connection 920 increases, $V_{GD}$ may quickly decrease until $I_{GIDL}$ is eliminated entirely. In either case, the power consumed by GIDL is reduced drastically or eliminated. Thus, power loss resulting directly from GIDL and also indirect power loss resulting from the charge pump driving the VWLOFF voltage applied to the drain 404 of the driver transistor 302 may also be reduced or eliminated entirely.

According to one embodiment, WLON may also remain at $V_{SS}$ during standby, lowering the gate to source voltage ($V_{GS}$) of the driver transistor 302. Thus, any $I_{GIDL}$ current flowing from the N-well 408 to the source 406 of the driver transistor 302 due to GIDL caused by $V_{GS}$ may also be reduced or eliminated. Also, power consumption by the charge pumps due to GIDL current between the N-well 408 and source 406 of the driver transistor 302 may be reduced, thereby reducing the overall power consumption due to GIDL.

In one embodiment of the invention, the cut-off transistor 908 utilized by the local wordline driver 900 may also be used in conjunction with switching the voltage applied to the N-well 408 of the driver transistor 302 during standby as described with respect to FIGS. 6-7. Accordingly, even if some small amount of GIDL remains (e.g., due to a capacitive charge retained on the floating node between the driver transistor 302 and the cut-off transistor 908, or between the N-well 408 and the source 406 of the driver transistor 302 due to the gate 402 to source 406 voltage, $V_{GS}$), the power consumption from any remaining GIDL may be reduced by switching the N-well voltage of the driver transistor 302 from the boosted high voltage $V_{PP}$ to the high power supply voltage $V_{DD}$ (or in some cases, $V_{SS}$) during the standby mode of the local wordline driver 216. According to one embodiment of the invention, the voltage of the N-well 1008 of the cut-off transistor 908 may also be switched from $V_{PP}$ to $V_{DD}$ during standby mode to reduce any GIDL in the cut-off transistor 908.

Modified Local Wordline Driver for Reducing GIDL

Figure 10:
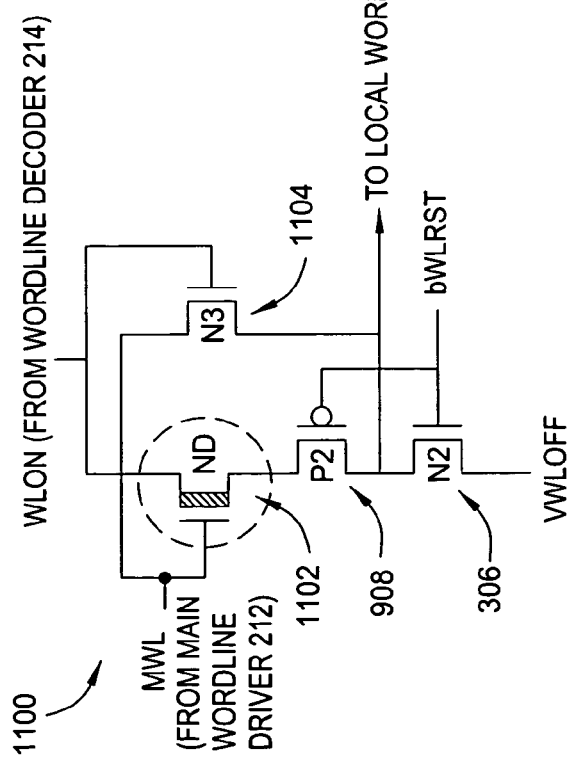
FIG. 10 is a circuit diagram which depicts a modified local wordline driver which may be used to reduce or eliminate GIDL according to one embodiment of the invention.

According to another embodiment of the invention, the local wordline driver 216 may be modified to reduce or eliminate GIDL. FIG. 10 depicts a modified local wordline driver 1100 which may be used to reduce or eliminate GIDL according to one embodiment of the invention. According to one embodiment of the invention, the inverter formed by the PMOS driver transistor 302 and the NMOS transistor 304 in the local wordline driver 216 (depicted in FIG. 3) may be replaced by an NMOS depletion mode transistor ND 1102 and an NMOS transistor N3 1104.

An NMOS depletion mode transistor is a transistor which may conduct current between the source and drain of the transistor even when a low voltage or no voltage is applied to the gate of the transistor. When a high voltage is applied to the depletion mode transistor 1102, the transistor 1102 may be fully turned on. In some cases, when a low voltage is applied, the depletion mode transistor 1102 may act as a resistor. When a downward driven negative voltage (e.g., VWLOFF) is applied to the depletion mode transistor 1102, the transistor 1102 may be fully turned off.

During operation of the local wordline driver 1100, bWLRST may be a low voltage (e.g., $V_{SS}$), turning the cut-off transistor 908 on and allowing current (if any is present) to flow from the drain of the depletion mode transistor 1102 to the local wordline 242. The local wordline 242 may be selected where WLON is a boosted high voltage $V_{PP}$ and MWL is a high voltage $V_{PP}$. When WLON is a boosted high voltage $V_{PP}$ and MWL is a high voltage $V_{PP}$, the depletion mode transistor 1102 may be turned on (as well as the NMOS transistor N3 1104), allowing the boosted high voltage $V_{PP}$ to be driven onto the local wordline 242 by the local wordline driver 1100.

When the column of local wordlines containing the local wordline driver 1100 is not selected by the wordline decoder 214 (WLON=$V_{SS}$) but the main wordline 240 for the local wordline driver 1100 is selected (e.g., MWL=$V_{PP}$) during operation, the depletion mode transistor 1102 may be turned on but PMOS 908 may remain off (bWLRST=Vdd), thus deselecting the local wordline.

When the column of local wordlines containing the local wordline driver 1100 is selected by the wordline decoder 214 (WLON=$V_{PP}$) but the main wordline 240 for the local wordline driver 1100 is not selected (e.g., MWL=VWLOFF) during operation, the depletion mode transistor 1102 may be turned completely off. To prevent the wordline 242 from being selected in this case (because the main wordline 240 is not selected), the NMOS transistor N3 1104 may be turned on by WLON ($V_{PP}$) and may drive MWL (VWLOFF) onto the local wordline 242, maintaining the local wordline at VWLOFF and deselecting the local wordline 242. Thus, the NMOS transistor N3 1104 provides a hold-off function for the local wordline driver 1100. Accordingly, in some cases, the NMOS transistor N3 1104 may be referred to as the hold-off transistor 1104.

When the local wordline driver 1100 is placed in a standby mode, bWLRST may be raised to a high logic level ($V_{DD}$), turning the PMOS cut-off transistor P1 908 off and turning the NMOS transistor N2 306 on, thus driving VWLOFF (or $V_{SS}$ in some cases) onto the local wordline 242 and thereby deselecting the local wordline 242. During the standby mode, the main wordline 240 may be deselected by applying the downward-driven low voltage to the main wordline 240 (MWL=VWLOFF). Also, the WLON signal may be set to the low power supply voltage $V_{SS}$. When MWL is equal to VWLOFF and WLON is equal to $V_{SS}$, both the depletion mode transistor 1102 and the hold-off transistor 1104 may be turned off.

Figure 11:
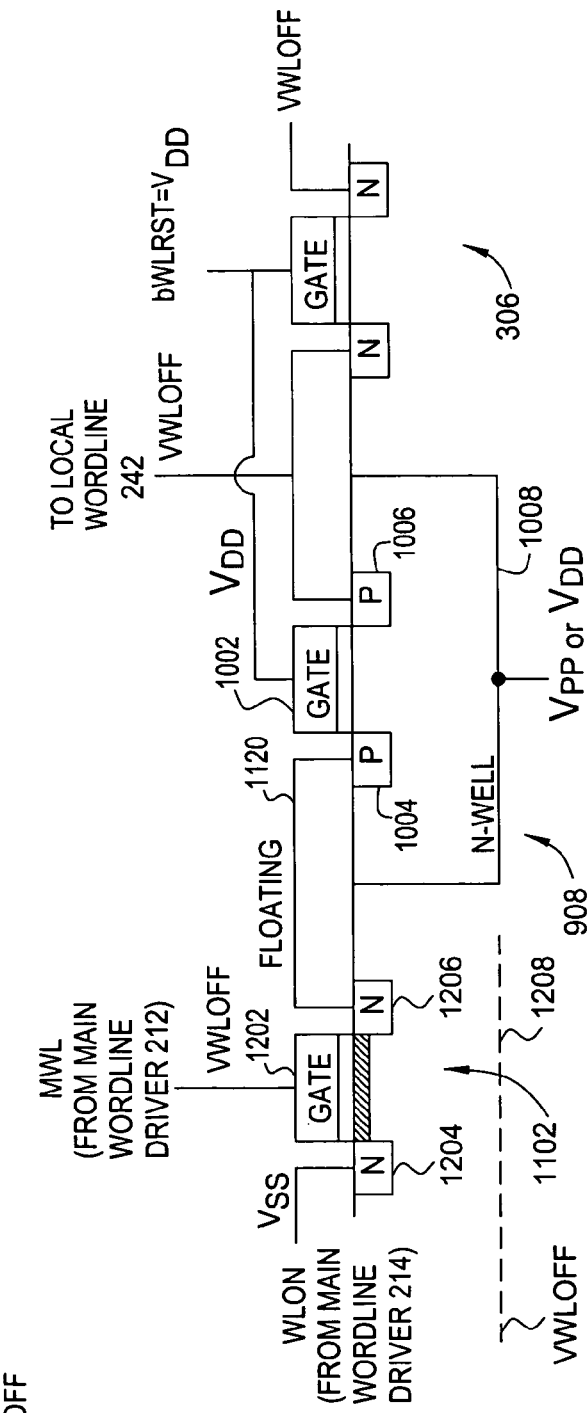
FIG. 11 is a substrate view which depicts transistors in the modified local wordline driver during the standby mode according to one embodiment of the invention.

FIG. 11 is a substrate view which depicts transistors 1102, 908, 306 in the modified local wordline driver 1100 during the standby mode according to one embodiment of the invention.

With respect to the depletion mode transistor 1102 the gate 1202 to source 1204 voltage ($V_{GS}$=VWLOFF-$V_{SS}$) is small, and GIDL between the source 1204 and substrate 1208 is accordingly greatly reduced or eliminated entirely. Also, the connection 1102 between the drain 1206 of the depletion mode transistor 1102 and the source 1004 of the cut-off transistor 908 is floated (described above with respect to FIGS. 9-10), reducing or eliminating GIDL between the substrate 1208 (at voltage VWLOFF) and drain 1206 of the depletion mode transistor 1102.

With respect to the cut-off transistor 908, the gate 1002 to source voltage 1004 $V_{GS}$ (and thus GIDL) is minimized by floating the source connection 1120. In addition, because the gate 1002 of the cut-off transistor is driven by the high power supply voltage $V_{DD}$ instead of the boosted high voltage $V_{PP}$, $V_{GD}$ in the cut-off transistor 908 is reduced ($V_{GD}$=$V_{DD}$-VWLOFF), also reducing GIDL. In one embodiment of the invention, charge pump power consumption due to $I_{GIDL}$ between the gate 1006 and N-well 1008 of the cut-off transistor 908 may also be reduced by switching the N-well voltage of the cut-off transistor 908 from $V_{PP}$ to $V_{DD}$ during standby mode as described above with respect to FIGS. 6-7.

While described above with respect to a local wordline driver in a segmented memory, embodiments of the invention may also be used effectively with any type of wordline driver in any type of memory. Also, while GIDL is described with respect to a leakage current from an N-well to a drain in a PMOS transistor, embodiments of the invention may be used to effect with leakage currents from any type of substrate to a source or a drain in any type of transistor, and also for leakage currents flowing in the opposite direction. Furthermore, while some voltages are described as being downward-driven low voltages (e.g., VWLOFF) or boosted high voltages (e.g., $V_{PP}$) driven by a charge pump, embodiments of the invention may be used where such signals are not driven by a charge pump. Embodiments of the invention may also be used to effect where such downward-driven or boosted signals (e.g., VWLOFF or $V_{PP}$) are replaced with low power supply voltages or high power supply voltages (e.g., $V_{SS}$ or $V_{DD}$), or with any other voltages which are different with respect to one another.

Furthermore, while the foregoing is directed to embodiments of the present invention, other and further embodiments of the invention may be devised without departing from the basic scope thereof, and the scope thereof is determined by the claims that follow.

What is claimed is:

1. A method for reducing gate induced drain leakage in a wordline driver, the method comprising:
    applying a boosted voltage to an N-well of the wordline driver if the wordline driver is in an operational mode, wherein a charge pump generates the boosted voltage from a power supply voltage; and
    applying the power supply voltage to the N-well of the wordline driver if the wordline driver is in a standby mode.

2. The method of claim 1 wherein the wordline driver is a local wordline driver in a segment of a segmented memory array.

3. A method for reducing gate induced drain leakage in a wordline driver, the method comprising:
    applying a boosted voltage to an N-well of the wordline driver if the wordline driver is in an operational mode, wherein a charge pump generates the boosted voltage from a power supply voltage; and
    applying the power supply voltage to the N-well of the wordline driver if the wordline driver is in a standby mode, wherein the local wordline driver is in the standby mode when the segment is not selected by a main wordline and when the segment of the local wordline driver is selected and the local wordline is not selected.

4. The method of claim 3, wherein a gate of a PMOS transistor in the N-well of the local wordline driver is connected to the main wordline, wherein a source of the PMOS transistor is connected to a selection line for selecting the local wordline driver, and wherein the drain of the local wordline driver is connected to a local wordline.

5. A method for reducing gate induced drain leakage in a wordline driver, the method comprising:
    driving a wordline to a boosted voltage with a driver transistor of the wordline driver if the wordline driver is in an operational mode;
    driving the wordline to a downward-driven voltage if the wordline driver is in a standby mode; and
    electrically isolating the driver transistor from the downward-driven voltage of the wordline when the wordline driver is in the standby mode.

6. The method of claim 5 wherein the wordline driver is a local word line driver in a segment of a segmented memory array.

7. The method of claim 6, wherein the local wordline driver is in the standby mode when the segment is not selected by a main wordline and when the segment of the local wordline driver is selected and the local wordline is not selected.

8. The method of claim 5,
    wherein a charge pump generates the boosted voltage from a power supply voltage;
    wherein the boosted voltage is applied to an N-well of the driver transistor when the wordline driver is in the operational mode, and
    wherein the power supply voltage is applied to the N-well of the driver transistor when the wordline driver is in the standby mode.

9. The method of claim 5, wherein electrically isolating the driver transistor from the downward-driven voltage comprises:
    floating a drain connection of the driver transistor; and
    applying a power supply voltage to a source of the driver transistor, wherein the power supply voltage is used by a charge pump to generate the downward-driven voltage.

10. A wordline driver having a reduced gate induced leaked current during a standby mode comprising:
    driver circuitry to drive a wordline to a boosted voltage with an NMOS depletion mode driver transistor if the wordline driver is in an operational mode and to drive the wordline to a downward-driven voltage if the wordline driver is in the standby mode; and
    isolation circuitry to electrically isolate the driver transistor from the downward-driven voltage of the wordline when the wordline driver is in the standby mode.

11. The wordline driver of claim 10, wherein the isolation circuitry comprises a PMOS cut-off transistor, the cut-off transistor configured to electrically isolate the driver transistor from the downward-driven voltage of the wordline when the wordline driver is in the standby mode.

12. The wordline driver of claim 11, further comprising
    a charge pump which generates the boosted voltage from a power supply voltage, wherein the boosted voltage is applied to an N-well of the cut-off transistor when the wordline driver is in the operational mode, and wherein the power supply voltage is applied to the N-well of the cut-off transistor when the wordline driver is in the standby mode.

13. The wordline driver of claim 10, wherein the wordline driver is a local wordline driver in a segment of a segmented memory array.

14. The wordline driver of claim 13, further comprising:
    an NMOS hold-off transistor configured to apply the downward-driven voltage to a local wordline of the local wordline driver when a local wordline driver select signal deselects the local wordline driver and a main wordline signal selects a main wordline controlling the local wordline driver.

15. A wordline driver having a reduced gate induced leaked current during a standby mode comprising:
    a charge pump configured to generate a boosted voltage from a power supply voltage; and
    voltage selection circuitry configured to apply the boosted voltage to an N-well of the wordline driver if the wordline driver is in an operational mode and apply the power supply voltage to the N-well of the wordline driver if the wordline driver is in the standby mode.

16. The wordline driver of claim 15 wherein the wordline driver is a local wordline driver in a segment of a segmented memory array.

17. A wordline driver having a reduced gate induced leaked current during a standby mode comprising:
   a charge pump configured to generate a boosted voltage from a power supply voltage; and
   voltage selection circuitry configured to apply the boosted voltage to an N-well of the wordline driver if the wordline driver is in an operational mode and apply the power supply voltage to the N-well of the wordline driver if the wordline driver is in the standby mode, wherein the wordline driver is a local wordline driver in a segment of a segmented memory array and the local wordline driver is in the standby mode when the segment is not selected by a main wordline and when the segment of the local wordline driver is selected and the local wordline is not selected.

18. A wordline driver having a reduced gate induced leaked current during a standby mode, comprising:
   driver circuitry configured to:
      drive a wordline to a boosted voltage with a driver transistor of the wordline driver if the wordline driver is in an operational mode; and
      drive the wordline to a downward-driven voltage if the wordline driver is in the standby mode; and
   electrical isolation circuitry configured to electrically isolate the driver transistor from the downward-driven voltage of the wordline when the wordline driver is in the standby mode.

19. The wordline driver of claim 18 wherein the wordline driver is a local wordline driver in a segment of a segmented memory array.

20. A wordline driver having a reduced gate induced leaked current during a standby mode, comprising:
   driver circuitry configured to:
      drive a wordline to a boosted voltage with a driver transistor of the wordline driver if the wordline driver is in an operational mode; and
      drive the wordline to a downward-driven voltage if the wordline driver is in the standby mode; and
   electrical isolation circuitry configured to electrically isolate the driver transistor from the downward-driven voltage of the wordline when the wordline driver is in the standby mode, wherein the wordline driver is a local wordline driver in a segment of a segmented memory array and the local wordline driver is in the standby mode when the segment is not selected by a main wordline and when the segment of the local wordline driver is selected and the local wordline is not selected.

21. The wordline driver of claim 20, further comprising:
   a power supply configured to generate a voltage;
   a charge pump configured to generate the boosted voltage from the voltage;
   voltage selection circuitry configured to apply the boosted voltage to an N-well of the driver transistor when the wordline driver is in the operational mode and apply the voltage to the N-well of the driver transistor when the wordline driver is in the standby mode.

22. A wordline driver having a reduced gate induced leaked current during a standby mode, comprising:
   driver circuitry configured to:
      drive a wordline to a boosted voltage with a driver transistor of the wordline driver if the wordline driver is in an operational mode; and
      drive the wordline to a downward-driven voltage if the wordline driver is in the standby mode; and
   electrical isolation circuitry configured to electrically isolate the driver transistor from the downward-driven voltage of the wordline when the wordline driver is in the standby mode, wherein the electrical isolation circuitry is configured to:
   float a drain connection of the driver transistor; and
   apply a power supply voltage to a source of the driver transistor, wherein the power supply voltage is used by a charge pump to generate the downward-driven voltage.

23. A wordline driver having a reduced gate induced leaked current during a standby mode comprising:
   means for driving a wordline configured to:
      drive the wordline to a boosted voltage with a driver transistor of the wordline driver if the wordline driver is in an operational mode; and
      drive the wordline to a downward-driven voltage if the wordline driver is in the standby mode; and
   means for electrically isolating configured to electrically isolate the driver transistor from the downward-driven voltage of the wordline when the wordline driver is in the standby mode.

24. The wordline driver of claim 23, further comprising:
   means for generating a first voltage;
   means for boosting the voltage;
   means for selecting a voltage, the means for selecting configured to apply the boosted voltage to an N-well of the driver transistor when the wordline driver is in the operational mode and apply the first voltage to the N-well of the driver transistor when the wordline driver is in the standby mode.

25. The wordline driver of claim 23, wherein the means for electrically isolating is configured to:
   float a drain connection of the driver transistor; and
   apply a power supply voltage to a source of the driver transistor, wherein the power supply voltage is used by a charge pump to generate the downward-driven voltage.

* * * * *